US008014167B2

(12) United States Patent
Gunderson et al.

(10) Patent No.: US 8,014,167 B2
(45) Date of Patent: Sep. 6, 2011

(54) LIQUID CRYSTAL MATERIAL SEALED HOUSING

(75) Inventors: Neal F. Gunderson, Lake Elmo, MN (US); Daniel D. Dittmer, Shakopee, MN (US); Michael A. Mewes, Belle Plaine, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 334 days.

(21) Appl. No.: 11/851,820

(22) Filed: Sep. 7, 2007

(65) Prior Publication Data

US 2009/0073328 A1 Mar. 19, 2009

(51) Int. Cl.
*H05K 7/18* (2006.01)

(52) U.S. Cl. ........ 361/800; 361/685; 361/760; 174/250; 174/262; 174/526; 174/535; 174/541; 174/548; 360/97.01; 360/97.02; 29/830; 438/29; 349/86; 349/149; 349/155; 349/156; 349/157; 349/190

(58) Field of Classification Search .................. 361/800, 361/685, 760; 174/250, 262, 526, 535, 548, 174/541; 360/97.01, 97.02; 29/830; 438/29; 349/86, 149, 155–157, 190
See application file for complete search history.

(56) References Cited

U.S. PATENT DOCUMENTS

| | | | | |
|---|---|---|---|---|
| 3,771,855 A * | 11/1973 | Burns | ............................ | 349/156 |
| 3,799,649 A * | 3/1974 | Carlyle | ......................... | 349/122 |
| 3,807,833 A * | 4/1974 | Graham et al. | ................. | 349/60 |
| 3,885,860 A * | 5/1975 | Sorkin | ........................... | 349/125 |
| 4,095,876 A * | 6/1978 | Horsting et al. | .............. | 349/154 |
| 4,116,544 A * | 9/1978 | Soref | ............................. | 349/141 |
| 4,150,877 A * | 4/1979 | Kobale et al. | ................. | 349/131 |
| 4,630,894 A * | 12/1986 | Cremers | ....................... | 349/106 |
| 4,983,023 A * | 1/1991 | Nakagawa et al. | ........... | 349/157 |
| 5,043,139 A * | 8/1991 | Carnall et al. | ................ | 420/526 |
| 5,153,753 A * | 10/1992 | Ohta et al. | ...................... | 349/51 |
| 5,179,460 A * | 1/1993 | Hinata et al. | ................... | 349/149 |
| 5,364,669 A * | 11/1994 | Sumida et al. | ................. | 428/1.5 |
| 5,376,327 A * | 12/1994 | Di Natale et al. | ............. | 264/517 |
| 5,422,766 A * | 6/1995 | Hack et al. | ................. | 360/97.02 |
| 5,529,740 A * | 6/1996 | Jester et al. | .................... | 264/317 |
| 5,539,552 A * | 7/1996 | Desai et al. | ..................... | 349/104 |
| 5,631,753 A * | 5/1997 | Hamaguchi et al. | .......... | 349/110 |
| 5,654,354 A * | 8/1997 | Felten et al. | ................... | 524/147 |
| 5,691,794 A * | 11/1997 | Hoshi et al. | .................... | 349/158 |
| 5,818,556 A * | 10/1998 | Havens et al. | .................. | 349/92 |
| 5,831,710 A * | 11/1998 | Colgan et al. | ................. | 349/156 |
| 5,923,389 A * | 7/1999 | Seki | ................................ | 349/32 |
| 6,005,652 A * | 12/1999 | Matsuhira | ..................... | 349/149 |
| 6,053,744 A | 4/2000 | Gray et al. | | |
| 6,122,033 A * | 9/2000 | Mathew et al. | ............... | 349/155 |
| 6,168,459 B1 | 1/2001 | Cox et al. | | |
| 6,239,427 B1 * | 5/2001 | Mizue | ........................... | 250/239 |
| 6,270,375 B1 | 8/2001 | Cox et al. | | |
| 6,320,128 B1 * | 11/2001 | Glovatsky et al. | ............ | 174/548 |
| 6,320,257 B1 | 11/2001 | Jayaraj et al. | | |
| 6,407,793 B1 * | 6/2002 | Liang et al. | ................... | 349/139 |
| 6,547,616 B1 * | 4/2003 | Furukawa et al. | .............. | 445/24 |

(Continued)

*Primary Examiner* — Xiaoliang Chen
(74) *Attorney, Agent, or Firm* — Fellers, Snider, et al.

(57) ABSTRACT

A hermetically sealed housing having a base deck, a cover member and a seal assembly constructed of a liquid crystal material (LCM), the base deck and cover member forming an enclosure containing an inert gas atmosphere. Various embodiments have the LCM seal bonded to one or both of the base deck and cover member and bonded to seal the enclosure by molding, compression, adhesive bonding, thermoplastic welding or soldering, or a combination of such.

20 Claims, 4 Drawing Sheets

U.S. PATENT DOCUMENTS

| | | |
|---|---|---|
| 6,587,310 B1 | 7/2003 | Bennin et al. |
| 6,632,027 B1* | 10/2003 | Yoshida et al. ............... 385/88 |
| 6,636,290 B1 | 10/2003 | Glownia et al. |
| 6,856,490 B2 | 2/2005 | Rosner et al. |
| 6,867,367 B2 | 3/2005 | Zimmerman |
| 6,930,858 B2 | 8/2005 | Gunderson et al. |
| 6,970,329 B1 | 11/2005 | Oveyssi et al. |
| 7,016,145 B2 | 3/2006 | Gunderson et al. |
| 7,019,942 B2 | 3/2006 | Gunderson et al. |
| 7,101,597 B2 | 9/2006 | Wang et al. |
| 7,128,801 B2 | 10/2006 | Smith et al. |
| 7,218,473 B2 | 5/2007 | Bernett et al. |
| 7,245,009 B2* | 7/2007 | Bosco et al. ............... 257/710 |
| 7,349,059 B2* | 3/2008 | Jiang et al. ............... 349/187 |
| 7,420,817 B2* | 9/2008 | Eskridge ............... 361/760 |
| 7,743,963 B1* | 6/2010 | Chung ............... 228/179.1 |
| 7,874,846 B2* | 1/2011 | Gunderson et al. ........... 439/66 |
| 2002/0024498 A1* | 2/2002 | Vos et al. ............... 345/156 |
| 2002/0155280 A1* | 10/2002 | Yang ............... 428/335 |
| 2003/0081357 A1 | 5/2003 | Hong et al. |
| 2003/0179489 A1* | 9/2003 | Bernett et al. ............. 360/97.01 |
| 2004/0240804 A1* | 12/2004 | Mahapatra et al. ............ 385/94 |
| 2005/0001954 A1* | 1/2005 | Stephenson et al. ............ 349/86 |
| 2005/0264926 A1 | 12/2005 | Burts-Cooper et al. |
| 2005/0274932 A1* | 12/2005 | Knight et al. ............... 252/500 |
| 2006/0028612 A1* | 2/2006 | Smith et al. ............... 349/190 |
| 2006/0029338 A1* | 2/2006 | Rodriguez-Parada et al. . 385/94 |
| 2007/0001287 A1* | 1/2007 | Bosco et al. ............... 257/704 |
| 2007/0010702 A1* | 1/2007 | Wang et al. ............... 600/8 |
| 2007/0242341 A1* | 10/2007 | Natarajan et al. ............ 359/290 |
| 2007/0251719 A1* | 11/2007 | Sturdivant ............... 174/250 |
| 2007/0268621 A1* | 11/2007 | Bernett et al. ............. 360/97.02 |
| 2008/0033500 A1* | 2/2008 | Strother et al. ............... 607/36 |
| 2008/0033502 A1* | 2/2008 | Harris et al. ............... 607/45 |
| 2008/0057604 A1* | 3/2008 | Tanaka ............... 438/29 |
| 2008/0076061 A1* | 3/2008 | Figov ............... 430/270.1 |
| 2008/0174647 A1* | 7/2008 | Kwong et al. ............... 347/102 |
| 2008/0316641 A1* | 12/2008 | Gunderson et al. ........ 360/97.02 |
| 2009/0043032 A1* | 2/2009 | Kanno et al. ............... 524/445 |

* cited by examiner

LIQUID CRYSTAL MATERIAL SEALED HOUSING

BACKGROUND

It has been found desirable in some applications to provide a hermetically sealed housing. For example, data storage devices can be advantageously hermetically encapsulated to isolate an interior environment from contamination or other effects from the surrounding atmosphere.

The use of an internally enclosed inert gas atmosphere within a data storage device housing can also generally provide improved windage and hydrodynamic flight characteristics for read/write transducers adjacent a rotatable storage medium, as compared to a standard air atmosphere.

SUMMARY

Various embodiments of the present invention are generally directed to a hermetically sealed housing that encloses an inert gas atmosphere, the housing having a base deck, a cover member and a seal assembly constructed of a liquid crystal polymer (LCP). Various embodiments have the LCP seal bonded to one or both of the base deck and cover member and bonded to seal the enclosure by adhesive bonding, thermoplastic welding, or soldering.

DETAILED DESCRIPTION

Figure 1:
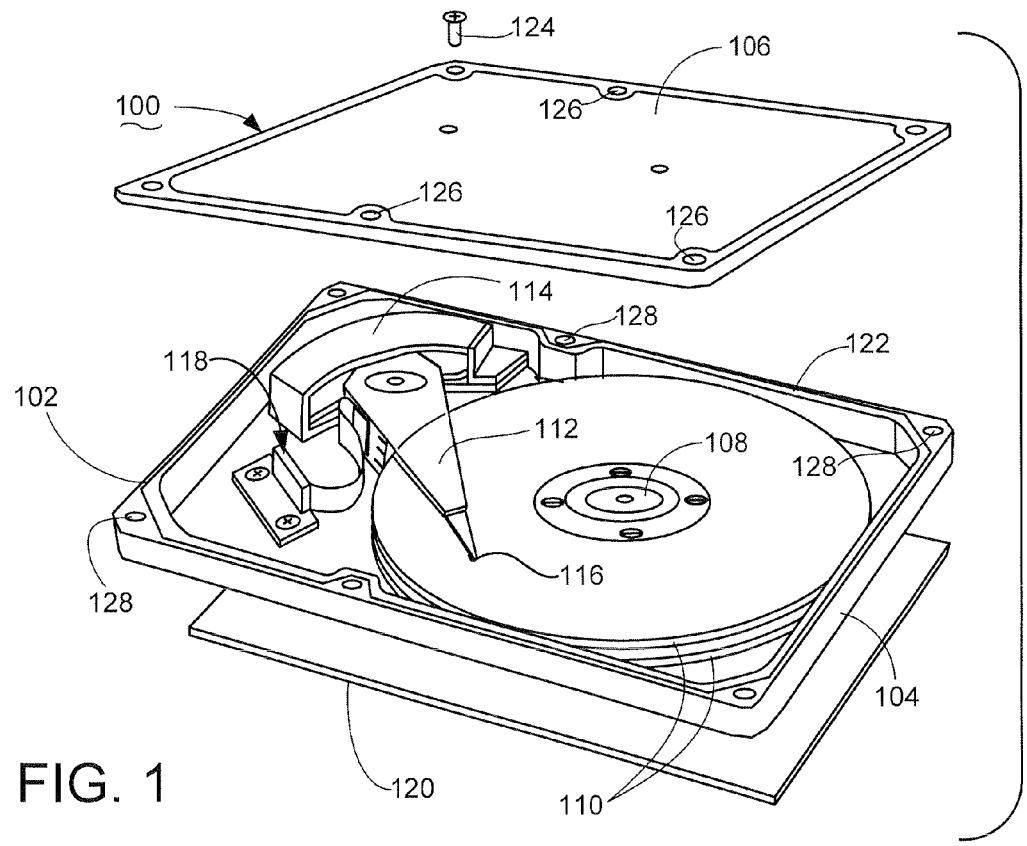
FIG. 1 is an exploded isometric view of a prior art data storage device that is exemplary of the type of device in which various embodiments of the present invention can be advantageously applied.

To illustrate various embodiments of the present invention, FIG. 1 shows a data storage device 100 as an exemplary environment in which various embodiments of the present invention can be advantageously practiced. It will be understood, however, that the claimed invention is not so limited.

The device 100 includes a sealed housing 102 formed from a base deck 104 and a top cover 106. A spindle motor 108 rotates a number of storage media disks 110. A head-stack assembly ("actuator") 112 rotates through application of current to a voice coil motor (VCM) 114 to align an array of transducers 116 with tracks defined on the media surfaces of the disks 110. A flex circuit assembly 118 establishes electrical communication paths between the actuator 112 and device control electronics on an externally disposed printed circuit board (PCB) 120.

A compression seal 122 is provided in a channel that extends about the upper portion of the base deck 104, and the top cover 106 is secured to the base deck 104 by a plurality of threaded bolts 124 (only one shown) that extend through spaced apart apertures 126 to engage threaded bores 128 peripherally spaced around the upper portion of base deck 104.

Figure 2:
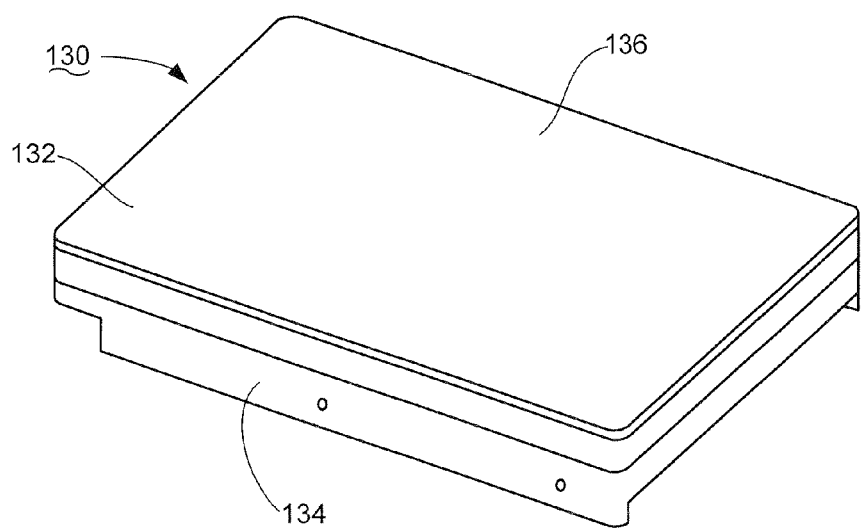
FIG. 2 is an isometric view of a storage device having a housing sealed in accordance with the present invention.

FIG. 2 is a view of a hermetically data storage device 130 generally similar to the device 100 and which incorporates an embodiment of the present invention to retain its inert fluid atmosphere, an internal atmosphere of helium and/or other inert, low density gases. The data storage device 130 has a sealed housing 132 formed from a base deck 134 and a top cover 136; enclosed within the interior of the housing 132 are mechanical and electronic components like those in the data storage device 100, and since the present invention involves the hermetic sealing of the housing 132, the internal electronic components need not be described further for the purpose of the present disclosure.

It will be noted that the data storage device 130 preferably has no fasteners extending through the top cover 136 to secure the top cover 136 to the base deck 134. Instead, the base deck and top cover 134, 136 are joined and sealed in a manner that will be described with reference to FIG. 3, which shows a cross section of the base deck 134 and top cover 136. Fasteners through the top cover 136 to secure the top cover 136 to the base deck 134 can be used with a hermetic seal provided the fasteners are positioned external to the hermetic seal.

Figure 3:
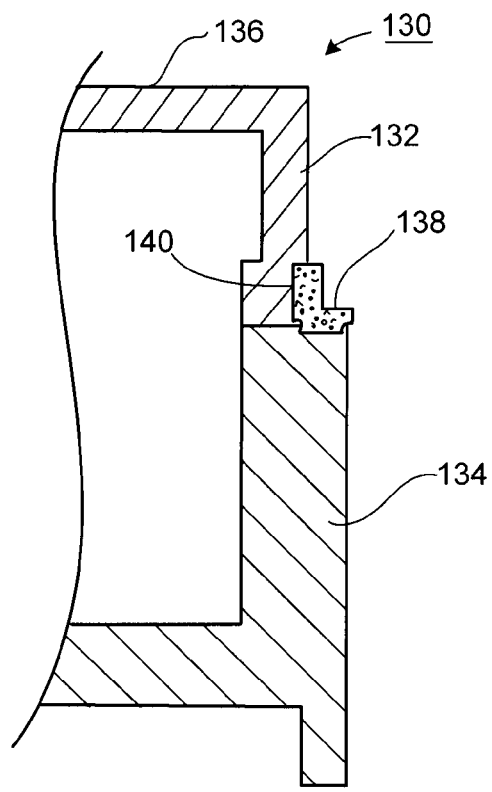
FIG. 3 is a partial, cut-away view in elevation of a portion of the housing of FIG. 2.

Shown in FIG. 3 is a slip-on seal member 138, sometimes herein referred to as a seal ring, that surrounds and slips over a lower portion of the top cover 136 that has a recessed groove 140 in which the seal member 138 is retained. The seal member 138 is a made of a liquid crystal polymer (LCP) material.

LCP has very low permeability for gases, especially low density gases such as helium, and is among the lowest permeability of most all polymers. It has been determined by the present inventors that LCP is about ten times less permeable to oxygen, water vapor and helium than other materials such as epoxy. The very low permeability of LCP has further been found substantially unaffected by change in relative humidity, and high temperature causes significantly smaller permeability increases than other polymers, which typically have more than a 10 times increase from 20° to 70° C.

The seal member 138 can be attached to the base plate 134 by any of several processes, including epoxy adhesion or thermoplastic welding. Further, selected regions of the seal member 138 can be pre-plated with a metallic coating that will further limit gas permeation. If epoxy adhesive is utilized, the seal member 138 is preferably adhesively bonded to both the base deck 134 and cover member 136. Thermoplastic welding of the seal member 138 to both the base deck and cover member can be achieved such as by a laser welder if the cover member is also made of LCP or other material transparent to the laser welder beam.

A suitable LCP material is commercially available under the trademark Zenite® by DuPont Corporation, Wilmington, Del., USA. An infrared absorbing material for use in a welding process is commercially available under the trademark Clearweld® by Gentex Corporation, Simpson, Pa., USA.

It has been found that LCP has additional features that make it particularly suitable for use in establishing a hermetic seal as disclosed herein. LCP material can be filled with suitable fibers (glass, carbon, etc.) to improve the base resin material characteristics. LCP can be selectively plated with a metallic or other electrically conductive layer, further reducing permeability to certain gases, such as helium, since certain metals can form a good sealing path against helium permeation. Thus, the housing components, namely the base deck 134 and cover member 136, can be plated, coated or over molded, and a suitable infrared absorbing material selectively applied to facilitate bonding.

Plating alternatively facilitates the use of soldering or other metal joining techniques to form a hermetic bond line. For example, with the use of appropriately selected fill and/or coating materials, the LCP sealing member can be laser welded or ultrasonic welded to form the requisite sealing junctures to metal, glass, or other suitable materials. It has been found that the LCP crystalline properties are largely maintained in the weld region, due to maintaining high polymer chain continuity in the liquid or softened state. LCP is also easily molded into thin high precision three-dimensional shapes and can be over-molded to metals and other base materials.

Liquid crystal thermoset (LCT) material has even lower permeation characteristics than that of standard LCP material and also can be filled and/or coated for laser welding capability. LCT is a moldable thermaloset material and has excellent adhesion to metals; furthermore, LCT crystalline properties are largely maintained in molded regions due to retention of high polymer chain continuity in the liquid or softened state. Thus, LCT can be readily substituted in each of the disclosed LCP molded applications herein.

Using LCT for the seal member 138, it is possible to achieve a small diameter molding for sealing the data storage device during the manufacturing process prior to performance testing of the data storage device 130, and when required, the small diameter mold line can be broken and the housing 132 opened for reworking. The housing 132 can then be resealed by further overmolding, and if desired, the mold line can be strengthened to assure sealing as required over the life of the device.

For purposes of clarity of expression, the general term liquid crystal material (LCM) as used herein shall be interpreted as encompassing either or both LCP and LCT materials, as the selection of which to use for a particular application will be within the skill and knowledge of those skilled in the art of manufacturing data storage devices in view of the present disclosure.

Figure 4:
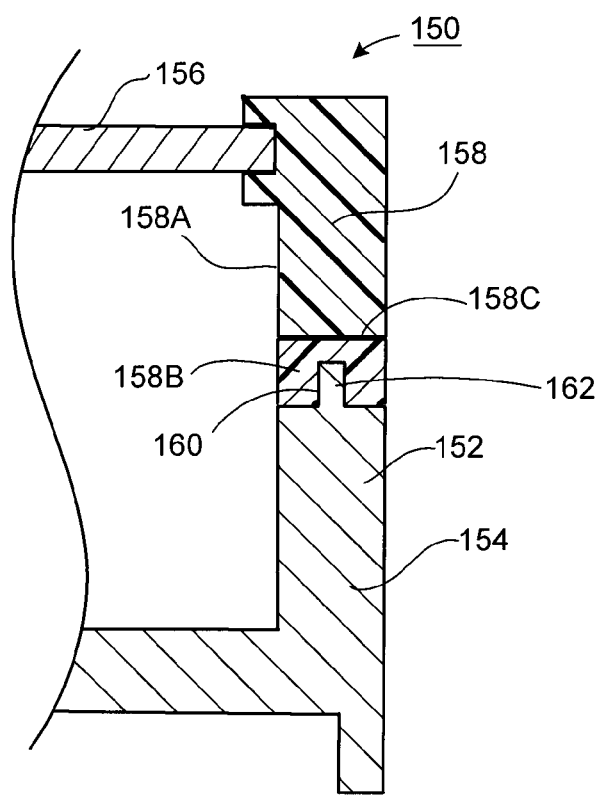
FIG. 4 is a view similar to FIG. 3 showing another embodiment of the present invention.

Shown in FIG. 4 is modified data storage device 150 that has a housing 152 comprising a base deck 154 and a top cover member 156. An LCP seal member 158 is over molded onto the cover member 156 as shown, and a groove 160 in the lower portion of the LCP seal member 158 fits over a tab member 162 extending from the wall of the base deck 154. Alternatively, the LCP seal member 158 can have a top portion 158A that is over molded onto the cover member 156, and a lower portion 158B that is over molded over the tab member 162.

There are several methods that can be used to attach the seal member to the housing to complete joinder and seal the interior of the data storage device 150. One of the base deck and the cover member can be constructed of LCP material, and with the LCP seal member 158 over-molded to the cover and base deck, the LCP used on one of the components can be filled (unfilled LCP is sufficiently transparent to IR) with an IR absorbent material, typically with carbon, to make the component absorbent to infra-red (IR) radiation so that an IR laser can be used for thermoplastic welding of the seal member 158.

Of course, epoxy adhesive forms an acceptable bond and can be used to bond the seal member 158 to the tab member 160; where the upper portion 158A of the seal member 158 is over molded to cover member 156 and the lower portion 158B thereof is over molded to the tab 162, the upper and lower portions 158A, 158B can be bonded at the interface 158C in the same manner just mentioned, that is, either by thermoplastic welding, adhesive bonding or soldering, any of which facilitates the breaking and reattachment that may be required for reworking defective devices.

Figure 5:
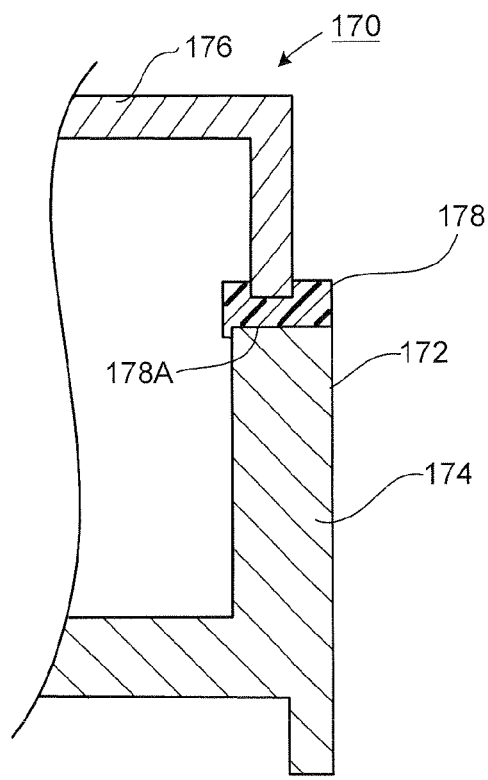
FIG. 5 is an isometric view of a storage device having another housing sealed in accordance with the present invention.

Shown in FIG. 5 is a modified data storage device 170 that has a housing 172 comprising a base deck 174 and a top cover member 176. An LCP seal member 178 is over molded onto the cover member 176 as shown. The LCP seal member 178 is plated over its entire surface, or at least along its lower edge that contacts the upper edge of the wall of the base deck 174 as depicted. This permits soldering of the LCP seal member 178 to the base deck 174 along the interface 178A.

Figure 6:
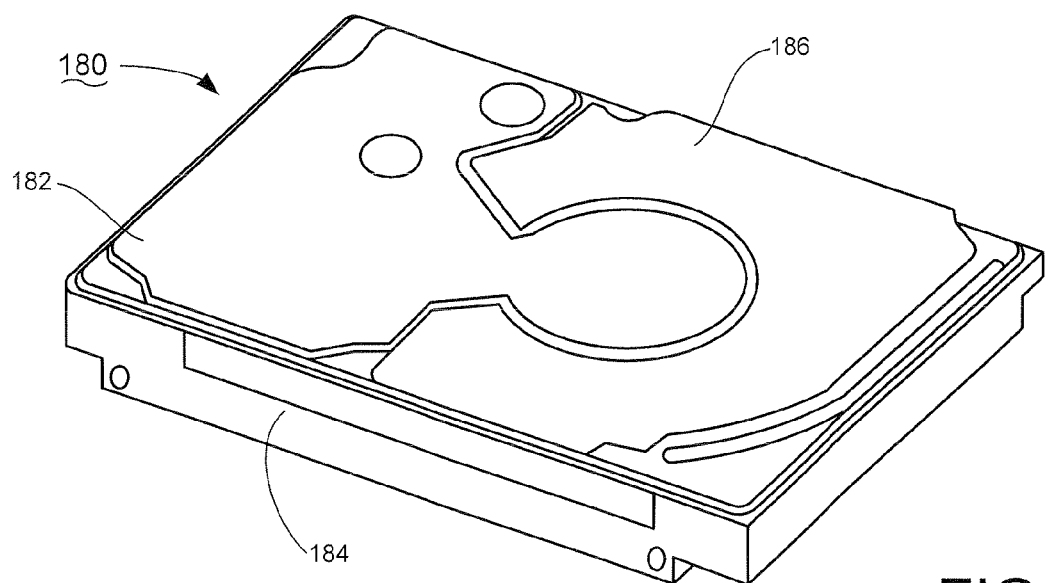
FIG. 6 is a partial, cut-away view of a portion of the housing of FIG. 5.
Figure 7:
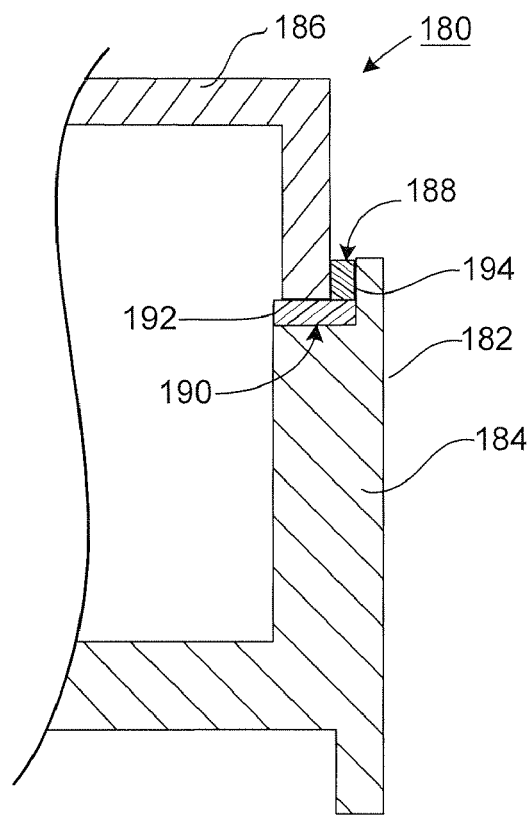
FIG. 7 is a partial, cut-away view in elevation of a portion of the housing of FIG. 5.

FIG. 6 shows yet another modified data storage device 180 that has a housing 182 that comprises a base deck 184 and a top cover member 186. The data storage device 100 features the LCP over-molding of cover member 186, and the joinder of cover member 186 to the base deck 184 without fastener screws. FIG. 7, a partial, cut-away view in elevation of a portion of the housing 182, shows the LCP seal assembly 188 that joins and seals the interior of the housing 182.

The LCP seal assembly 188 is disposed in a seal channel 190 formed in the upper edge of the wall of the base deck 184 and extends around the periphery of the base deck. The LCP seal assembly 188 comprises a first seal member 192 and a second seal member 194. The first seal member 192 is positioned in the seal channel 190 and bonded to the base deck 184 such as by an adhesive, molding or by thermal bonding. The second seal member 194 can be over molded to the cover member 186 or bonded thereto by an adhesive or thermal welding.

With the cover member 186 positioned on the base deck 184 in abutment with the first seal member 192, the second seal member 194 is positioned in the channel 190 to abutting the first seal member 192. The seal is completed by adhesively bonding or welding the first and second seals 192, 194 to hermetically seal the interior of the housing 182.

The seal assembly 188 has a long sealing path for reduced gas permeation positioned vertically. Since LCP can be molded in very high aspect ratios (ratio of wall height to wall thickness), the embodiment of FIG. 7 is especially applicable to small drives that have little room for additional sealing area. If desired, the LCP can be over-molded to the cover and the base, and the LCP seal member 190 can be filled, typically with carbon, to be absorbent to IR for thermoplastic laser welding, since an IR laser welder is more readily manipulated when its beam is vertical to the welded joint.

An alternative implementation of this concept would be to only over mold the seal member 192 on the base plate, and then use heat to do a re-workable cover to base bond for test purposes, after which a final seal would be LCP over-mold between the cover and the base plate. Another approach would be to heat or laser weld the cover member to a LCP base seal, and following final manufacturing performance testing, inject LCP between the cover member and the base plate for the final seal. These approaches are especially advantages for small drives, since cover to base screws could be eliminated.

An LCP compression or heat assisted compression seal using fasteners through the top cover to secure the top cover to the base deck can be used, provided that all the fasteners are external to the hermetic seal. Such a seal would have the advantage of being implemented with minimal changes to the data storage device design and manufacturing process.

Figure 8:
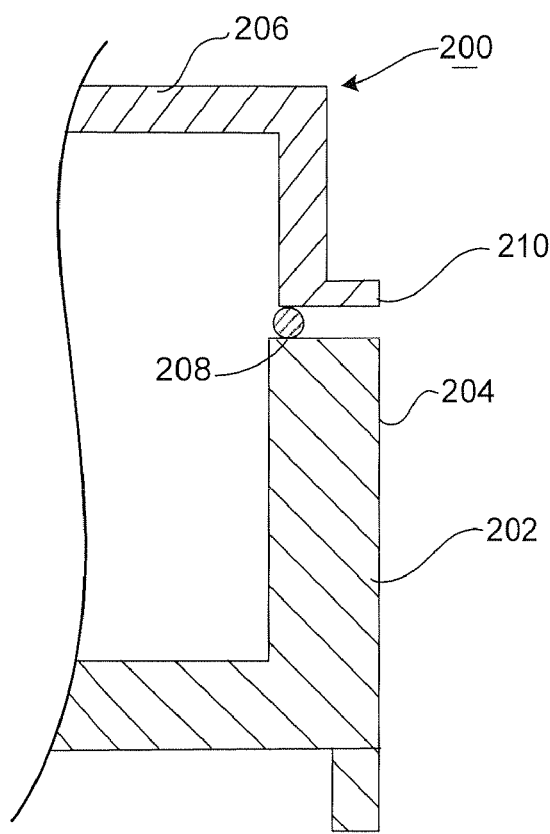
FIG. 8 is a partial, cut-away view in elevation of a portion of a housing in which the top cover member and base member sealed with a compression seal.

Accordingly, FIG. 8 shows a modified data storage device 200 that has a housing 202 comprising a base deck 204 and a top cover member 206. An LCP seal member 208 is positioned between the cover member 206 and base member 204 as shown. To form a hermetic seal the LCP seal member 208 is compressed between the cover member 206 and base member 204. This compression can be done with an external force with or without the assistance of fastening screws (not shown) mounted exterior to the LCP seal on a cover flange 210.

Heat can also be applied to the cover member 206, the base member 204 or the LCP seal member to assist in sealing the LCP seal member to the base and cover members 204, 206. If the LCP seal member 208 is carbon filled, an IR laser can be used to heat the LCP seal member 208 directly during compression. Since the heating of the LCP seal member 208 would only soften and not melt it, the fasteners would be used to maintain sufficient seal compression during operation. While the LCP seal member is shown as being round, or ring shaped, it will be appreciated that the LCP seal member can have a variety of shapes as the present invention is not limited to the shape of the LCP seal member.

It will be appreciated that the various embodiments presented herein provide advantages over the prior art. The use of LCP and/or LCT seals provide suitable low permeability characteristics to encapsulate an inert gas atmosphere, such as helium, within the housing, and a number of bonding methods can be employed including molding, compression, adhesive bonding, soldering and thermoplastic welding. Further, while embodiments have been generally directed to a housing of a data storage device, such are merely illustrative and not limiting to the claimed subject matter. Rather, any number of suitable environments can be utilized as desired.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. An apparatus comprising:
    a housing having a base deck and a cover member; and
    a liquid crystal material (LCM) seal adjoining the base deck and the cover member to enclose an inert gas atmosphere, the LCM seal plated with a metal coating and bonded to at least one of the base deck and the cover member via a metal-to-metal seam.

2. The apparatus of claim 1, wherein the inert gas atmosphere substantially comprises helium.

3. The apparatus of claim 1 wherein the LCM seal is bonded to one of the base deck and cover member via solder.

4. The apparatus of claim 3, wherein the solder contactingly engages the plated LCM seal, the cover member and the base deck.

5. The apparatus of claim 1, wherein the LCM seal is overmolded onto a selected one of the cover member or the base deck, and the metal-to-metal seam is formed between the metal coating of the LCM seal and a remaining one of the cover member or the base deck.

6. The apparatus of claim 1, in which the LCM seal hermetically seals the enclosed inert gas atmosphere within the housing.

7. The apparatus of claim 1, wherein the LCM seal comprises a base resin of liquid crystal polymer filled with reinforcing fibers.

8. The apparatus of claim 1, in which the LCM seal is thermally welded to provide the metal-to-metal seam.

9. An apparatus comprising a hermetically sealed housing which encloses an inert gas atmosphere, the housing comprising a base deck, a cover member, and a seal interposed therebetween, the seal comprising a liquid crystal material (LCM) plated with a layer of metal, said plated layer bonded to at least a selected one of the base deck or the cover member to provide a metal-to-metal seam.

10. The apparatus of claim 9, in which the selected one of the base deck or the cover member is formed of metal, and a layer of solder adjoins said selected one of the base deck or the cover member with the plated layer of the LCM seal.

11. The apparatus of claim 9, in which both the base deck and the cover member are formed of metal, and the layer of solder respectively adjoins the base deck and the cover member with the plated layer of the LCM seal.

12. The apparatus of claim 9, further comprising a fastener which compresses the LCM seal between the top cover and the base deck.

13. The apparatus of claim 9, in which the cover member and the base deck are each formed of metal.

14. The apparatus of claim 13, in which the plated layer of the LCM seal is soldered to the metal cover member and the metal base deck.

15. A method of hermetically sealing a housing having a cover member and a base deck, the method comprising:
    placing a liquid crystal material (LCM) seal between the cover member and the base deck, the LCM seal having a metal coating layer; and
    bonding the metal coating layer of the LCM seal to the base deck and the cover member to form a metal-to-metal seal that retains an inert gas atmosphere within the housing.

16. The method of claim 15, wherein the inert gas atmosphere is characterized as a helium atmosphere.

17. The apparatus method of claim 15 wherein the bonding step comprises soldering the metal coating layer to at least a selected one of the base deck or cover member to seal the housing.

18. The method of claim 17, further comprising molding the LCM seal to one of the cover member or the base deck prior to the bonding step.

19. The method of claim 15, in which the LCM seal comprises a first seal member and a second seal member, the method further comprising molding the first seal member to the cover member, molding the second member to the base deck, and soldering the first seal member to the second seal member to seal the enclosure.

20. The method of claim 15 wherein the step of bonding the first and second seal members comprises thermally welding the first seal member to the second seal member.

* * * * *